United States Patent
Kim et al.

(10) Patent No.: US 6,856,452 B2
(45) Date of Patent: Feb. 15, 2005

(54) FILTER-FREE WAVELENGTH CONVERTER

(75) Inventors: Jong Hoi Kim, Daejon-Shi (KR);
Kwang Ryong Oh, Daejon-Shi (KR);
Yong Soon Baek, Daejon-Shi (KR);
Hyun Soo Kim, Daejon-Shi (KR);
Kang Ho Kim, Daejon-Shi (KR)

(73) Assignee: Electronics and Telecommunications Research Institute (KR)

( * ) Notice: Subject to any disclaimer, the term of this patent is extended or adjusted under 35 U.S.C. 154(b) by 95 days.

(21) Appl. No.: 10/334,937

(22) Filed: Dec. 31, 2002

(65) Prior Publication Data

US 2003/0151796 A1 Aug. 14, 2003

(30) Foreign Application Priority Data

Jan. 16, 2002 (KR) .................... 10-2002-0002496

(51) Int. Cl.⁷ .................................. G02F 1/365
(52) U.S. Cl. .................... 359/332; 359/326; 385/1
(58) Field of Search .................... 359/326–332; 385/1–3

(56) References Cited

U.S. PATENT DOCUMENTS

| 6,101,027 | A | * | 8/2000 | Lee et al. | 359/344 |
| 6,437,905 | B1 | * | 8/2002 | Joyner et al. | 359/332 |
| 6,563,627 | B2 | * | 5/2003 | Yoo | 359/326 |
| 6,577,435 | B1 | * | 6/2003 | Bang et al. | 359/326 |
| 2003/0030887 | A1 | * | 2/2003 | Lee et al. | 359/326 |

FOREIGN PATENT DOCUMENTS

| JP | 2003-57614 A | * | 2/2003 | G02F/1/025 |
| JP | 2003-57701 A | * | 2/2003 | G02F/2/00 |
| JP | 2003-57703 A | * | 2/2003 | G02F/2/02 |

* cited by examiner

Primary Examiner—John D. Lee
(74) Attorney, Agent, or Firm—Blakely Sokoloff Taylor & Zafman

(57) ABSTRACT

Filter-free wavelength converters for separating and rejecting an optical input signal. A first input port couples a continuous wave (CW) light. A second input port couples an optical input signal. A multimode interference semiconductor optical amplifier (MMI-SOA) determines the output port with the input port and intensity-modulation of the CW light with the optical input signal. A first output port guides the converted signal, and a second output port guides the optical input signal.

11 Claims, 3 Drawing Sheets

FILTER-FREE WAVELENGTH CONVERTER

BACKGROUND OF THE INVENTION

1. Field of the Invention

The invention concerns the field of integrated optics and fiber optic telecommunications and in particular filter-free wavelength converters for rejecting the optical input signal and guiding only the converted signal to the output of the converter.

Operation basis of wavelength conversion are cross gain modulation (XGM) or cross phase modulation (XPM) in semiconductor optical amplifiers (SOAs).

XGM is the method that is intensity-modulated a continuous wave (CW) light by gain-modulation with the intensity-modulated optical input signal in the SOA. As the intensity of the optical input signal increases, the gain is decreased and the intensity of the CW light also decreases. As the intensity of the optical input signal decreases, the gain increases and the intensity of the CW light also increases. Therefore, the information in the optical input signals can be transmitted to the required wavelength by using the CW light.

XPM method provides the phase modulation of the CW light with the optical input signal in the SOA. When the CW light propagates into the two paths, the path difference occurs due to refractive index change in the SOAs. The combination of two paths of propagated CW light cause the interference and the intensity of the CW light is modulated.

Wavelength converters can be operated in two ways in accordance with the input method of the optical input signal and the CW light.

First, the CW light and the optical input signal are launched in opposite directions each other. This method has an advantage that no filter is required to reject the optical input signal at the output of the converter. However, at both ends of the SOA, the recombination rate also decreases due to the carrier depletion, so that the conversion speed is degraded. Therefore, the waveform is seriously distorted and the conversion speed thereof decreases.

Second, the CW light and the optical input signal are coupled in the same direction for high-speed conversion. However, the filter is required in order to reject the optical input signal at the output of the converter or to output only the converted signal. This method provides conversion to the same wavelength.

Therefore, in the above-mentioned wavelength converter, it is necessary to use the CW light and the optical input signal in the same direction in order to improve the conversion speed. Thus, in order to simplify the configuration of the optical transmission system including wavelength converters, the function capable of separating or removing the optical input signal should be included.

2. Description of the Prior Art

Hereinafter, the embodiments of the configurations of wavelength converters will be explained with reference to the accompanying figures.

FIG. 1 shows a configuration of the multi-mode interference (MMI) mode converter. The MMI mode converter can separate a fundamental and a higher-order mode. (See U.S. Pat. No. 5,933,554, 1999. 8. 3) In this interferometer, because an output port is determined depending on the input port, the converted signal and the optical input signal can be separated. (See "Detailed experiment investigation of all active dual-order mode Mach-Zehnder wavelength converter", Electron. Letters, Vol. 36, No. 15)

The operating principle of the MMI mode converter is as follows. The optical input signal 1 is injected into the input port 3 of a first MMI coupler 5 and it is propagated to the first SOA 7. The signal induces phase modulation of the CW light 2 and the signal 1 is absorbed in the ports 11, 12 of a second MMI coupler 9. The CW light is injected into the central input port 4 and it is divided into the first MMI coupler 5 and the third MMI coupler 6. The CW light 2 is phase-modulated in the first SOA 7 and amplified in the second SOA 8. Thereafter, it is divided into the second MMI coupler 9 and the fourth MMI coupler 10. Then, the two paths of light are combined in the output port 13 and only the converted signal is yielded by constructive or destructive interference.

FIG. 2 shows the conventional XGM method, and in this method, the SOAs 24, 25 are parallel connected to the input and output ports of the MMI couplers 23, 27. The optical output signal 29 and the converted signal 26 are separated. (See "Monolithic Integrated Parallel Amplifier Structure for Filter-Free Wavelength Conversion", $13^{th}$ IPRM, 2001 International Conference on Indium Phosphide and Related Materials, Conference Proceedings FB1–5). In this structure, the injection currents into both of the SOAs 24, 25 are same. XGM occurs between the optical input signal 22 and CW light 21 in the SOAs 24, 25. Therefore, wavelength conversion is performed. In cross state, the signal and CW lights are led to different output ports when they are coupled into the different input ports, which enables the spatial separation of the input signal and CW light, resulting in filter-free wavelength conversion.

The structure using the MMI mode converter of FIG. 1 can separate the converted signal 26 and optical output signal 29. However, the MMI coupler having multiple stages has a limitation that the employed structure is complicated. Also, there exists a problem that the performance of the wavelength converter depends on that of the MMI couplers. The structure of FIG. 2 can separate the converted signal and optical output signal. However, the MMI coupler and the SOA should be integrated so that the structure thereof is more complicated.

SUMMARY OF THE INVENTION

Therefore, the object of the invention is to provide the simplified wavelength converter for separating and rejecting the optical input signal using multimode interference semiconductor optical amplifiers (MMI-SOAs). MMI-SOAs causes XGM and XPM and determines the output ports depending on the input ports in order to simplify the structure of the wavelength converter.

To achieve the above object, the invention provides an XGM based filter-free wavelength converter, which separates the optical input signal and converted signal. This consists of a first input port for coupling the CW light, a second input port for launching the optical input signal, an MMI-SOA for determining the output port depending on the input port and for modulating the CW light, a first output port for guiding the converted signal, and a second output port for transmitting the optical input signal.

Also, to achieve the above object, the invention provides an XPM based filter-free wavelength converter, which separates the converted signal and the optical input signals. In this configuration, the optical input signal causes phase modulation of the CW light in the MMI-SOA. This consists of an optical divider for dividing the CW light, a first MMI-SOA for occurring the phase modulation of the CW light by the optical input signal and for separating the CW light and optical input signal, a second MMI-SOA for amplifying the CW light, an optical combiner for combining the CW lights from the first and second MMI-SOA, a first output port for guiding the converted signal, and a second output port for separating the optical input signal.

BRIEF DESCRIPTION OF THE ATTACHED DRAWINGS

DESCRIPTION OF THE PREFERRED EMBODIMENT

The wavelength converter according to the present invention is implemented in two types below.

Figure 1:
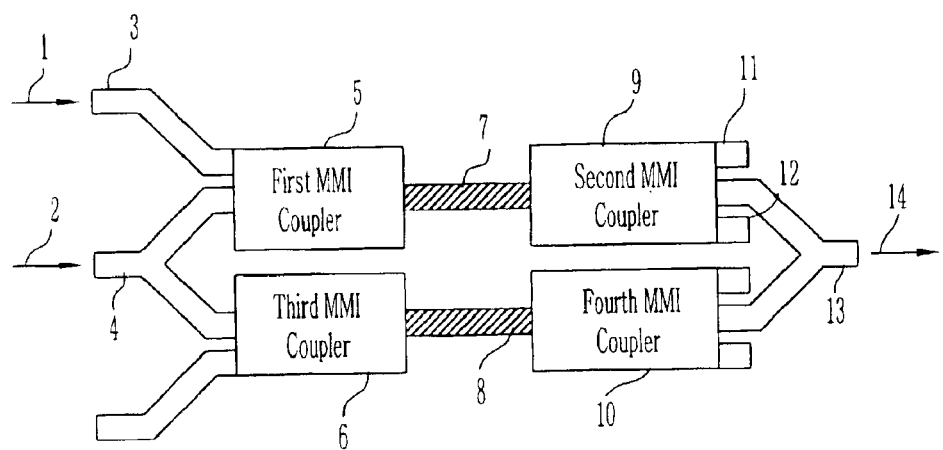
FIG. 1 shows a structure of a filter-free wavelength converter using the conventional XGM.
Figure 2:
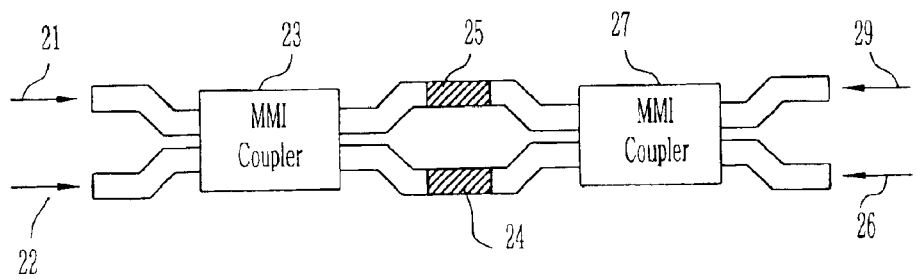
FIG. 2 shows a structure of a filter-free wavelength converter using the conventional XPM.
Figure 3:
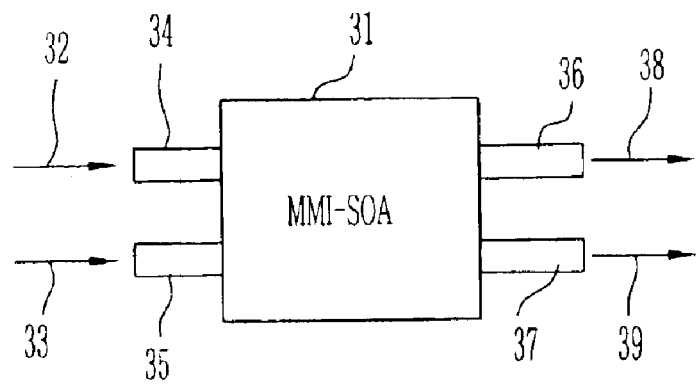
FIG. 3 shows a structure of an XGM based filter-free wavelength converter comprised of MMI-SOA in accordance with the present invention.

First, the XGM based filter-free wavelength converter shown in FIG. 3, comprises a first input port for launching the CW light, a second input port for coupling the optical input signal, an MMI-SOA for determining the output port depending on the input port, a first output port for guiding the converted signal, and a second output port for transmitting the optical input signal. The optical input signal causes the gain modulation in the MMI-SOA so that the CW light is intensity-modulated. At this time, if the CW light and the optical input signal are injected into the different input ports each other, they are also guided to the different output ports, so that the optical input signal and the converted signal are separated.

The input ports and output ports may be consisted of passive or active waveguides. The second output port may be consisted of an optical absorber.

Figure 4:
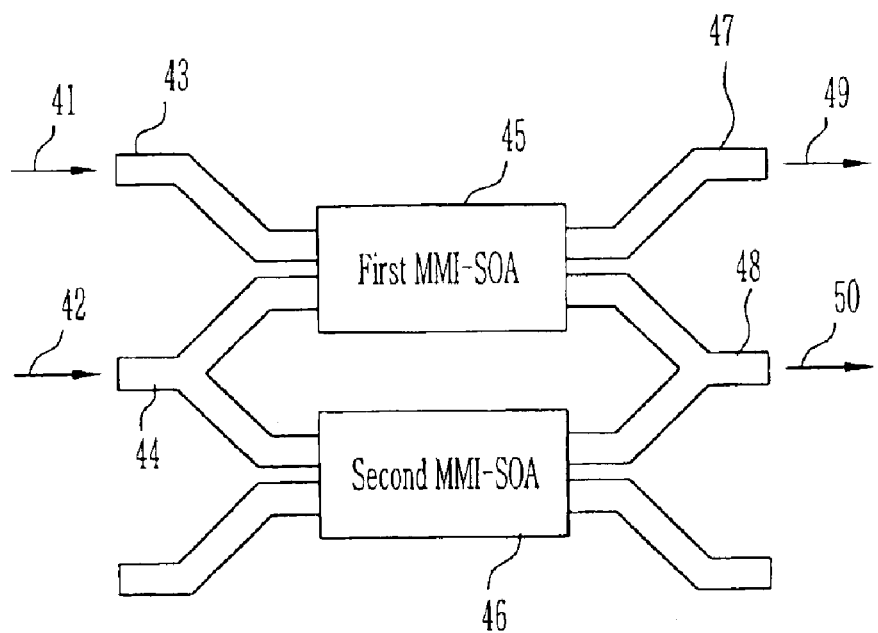
FIG. 4 shows a structure of an XPM based filter-free wavelength converter comprised of MMI-SOAs in accordance with the present invention.

Second, the XPM based filter-free wavelength converter shown in FIG. 4 comprises a first input port for coupling the CW light, a second input port for injecting the optical input signal, a first MMI-SOA for providing XPM, a second MMI-SOA for amplifying the CW light, an optical divider for dividing the CW light into the two paths, an optical combiner for combining the CW lights from the two MMI-SOAs, a first output port for guiding the converted signal, and a second output port for transmitting the optical input signal. The refractive index of the first MMI-SOA is changed due to the carrier density change with the optical input signal, so that the phase of the CW light is also changed. The converted signal is then generated due to constructive or destructive interference depending on the phase shift through the MMI-SOAs. The optical input signal from the second output port of the first MMI-SOA is separated from the converted signal.

The optical divider and optical combiner may be consisted of passive or active waveguides. The second output port may be consisted of an optical absorber.

Hereinafter, the embodiments of the present invention will be explained with reference to the accompanying drawings.

FIG. 3 shows the XGM based filter-free wavelength converter according to the invention. The optical input signal 32 is launched into the MMI-SOA 31 through the input port 34 and propagated to the output port 36. The CW light 33 is coupled into the MMI-SOA 31 through the input port 35 and propagated into the output port 37.

The operating principle of this structure is as follows. The gain of the MMI-SOA 31 is modulated with the optical input signal 32. The intensity of the CW light 33 is modulated with the gain modulation. Therefore, the information of the optical input signal 32 is transmitted to the CW light 33, resulting in wavelength conversion from the wavelength of the optical input signal to the wavelength of the CW light. Also, the optical output signal 38 is propagated to the output port 36 and the converted signal 39 is guided to the output port 37, thereby the two signals are separated each other.

FIG. 4 shows the XPM based filter-free wavelength converter of the present invention. The optical input signal 41 is coupled into the MMI-SOA 45 through the input port 43 and guided to the output port 47. The CW light 42 is injected into the input port 44 and divided into the first MMI-SOA 45 and the second MMI-SOA 46. Thereafter, the CW lights in two paths are combined again and emerged from the output port 48.

The operating principle of this structure is as follows. The optical input signal 41 induces a change in refractive index due to the change in carrier density of the MMI-SOA 45. At this time, the phase of the CW light 42 is modulated with the change in the refractive index. Then, the optical input signal 41 is combined with the CW light 42 and is subject to the interference. Therefore, the converted signal with the phase shift in the MMI-SOA 45 is generated from the output port 48. Also, the converted signal is separated from the optical input signal 49 and propagated to the output port 47 of the MMI-SOA 45.

Figure 5:
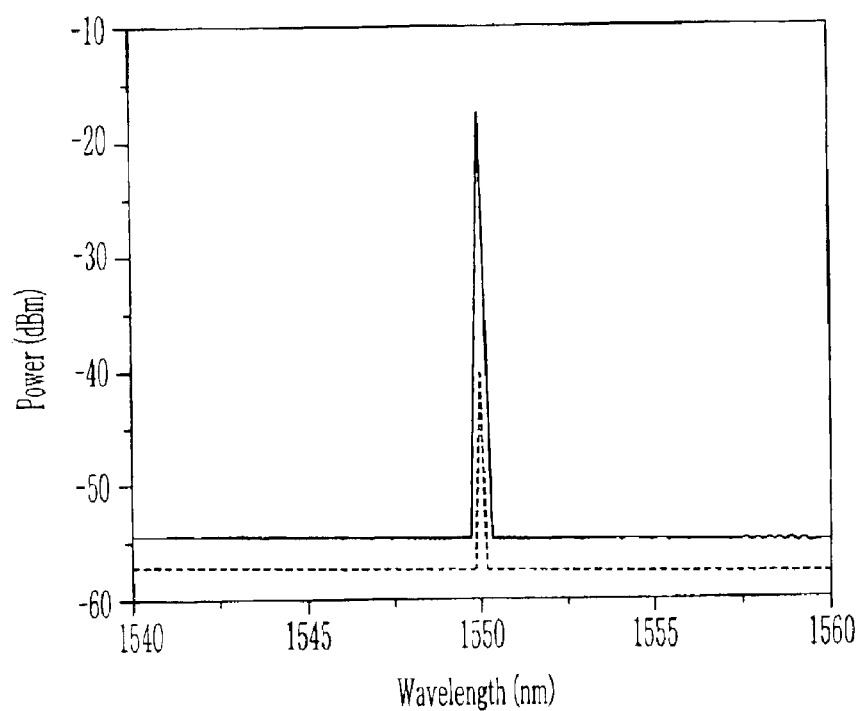
FIG. 5 shows a spectrum for measuring transparency of MMI-SOAs of FIG. 3

FIG. 5 shows a spectrum for measuring transparency of an exemplary optical amplifying converter according to an embodiment of the invention. The MMI-SOA is designed to guide an optical input signal 32 from the input port 34 to the output port 37. To ensure the separation of the output signals, the optical powers in the output port 36 and output port 37 are measured with a spectrometer while the optical input signal 32 is coupled. The measured input signal rejection ratio is about 20 dB as shown in FIG. 5. It means that the filter-free converter can be implemented using MMI-SOAs.

The wavelength converter of the invention does not require the optical filter for removing the optical input signal at the output, because the wavelength conversion is implemented while the converted signal is separated from the optical input signal.

Especially, owing to filter-free wavelength conversion, the use of a tunable light source is available so that the configuration of the wavelength division multiplexed (WDM) network system can be small-sized and variably employed, thereby the performance and the capacity of optical communication system can be improved.

Although the invention has been described in conjunction with the preferred embodiment, it is not limited to the embodiments, and it will be apparent to those skilled in the art that it can be modified in variation within the scope of the invention

What is claimed is:

1. A XGM based filter-free wavelength converter, comprising:

a first input port for coupling a CW light;

a second input port for coupling an optical input signal;

an MIMI-SOA for determining the output port with the input port and for intensity-modulation of the CW light with the optical input signal;

a first output port for guiding the converted signal; and a second output port for guiding the optical input signal.

2. A XGM based filter-free wavelength converter according to the claim 1, the input ports and output ports are consisted of passive waveguides.

3. A XGM based filter-free wavelength converter according to claim 1, wherein the input ports and output ports comprise an active layer.

4. A XGM based filter-free wavelength converter according to the claim 1, the second output port comprises an optical absorption layer.

5. A XGM based filter-free wavelength converter according to the claim 1, the MMI-SOA is an SOA in which the output port is determined by the input port.

6. A XGM based filter-free wavelength converter according to the claim 5, wherein the MMI-SOA is an SOA which causes the intensity-modulation of the CW light with the intensity change of the optical input signal.

7. A XPM based filter-free wavelength converter, comprising:

a first input port for coupling a CW light;

a second input port for coupling an optical input signal;

an optical divider for dividing the CW light into two paths of an interferometer;

a first MMI-SOA for determining the output port with the input port and for phase modulation of the CW light with the optical input signal;

a second MMI-SOA for determining the output port with the input port and for amplifying the CW light;

an optical combiner for combining the CW light from the MMI-SOAs;

a first output port for guiding the converted signal; and a second output port for guiding the optical input signal from the first MMI-SOA.

8. A XPM based filter-free wavelength converter according to the claim 7, wherein the optical divider and optical combiner comprise passive waveguides.

9. A XPM based filter-free wavelength converter according to the claim 7, wherein the optical divider and the optical combiner comprise an active layer.

10. A XPM based filter-free wavelength converter according to the claim 7, wherein the MMI-SOAs are an SOA in which the output port is determined by the input port.

11. A XPM based filter-free wavelength converter according to the claim 7, wherein the second output port comprises an optical absorption layer.

* * * * *